(12) United States Patent
Dong et al.

(10) Patent No.: US 12,306,504 B2
(45) Date of Patent: May 20, 2025

(54) DISPLAY PANEL AND DISPLAY DEVICE

(71) Applicant: WUHAN CHINA STAR OPTOELECTRONICS TECHNOLOGY CO., LTD., Hubei (CN)

(72) Inventors: Shuya Dong, Hubei (CN); Bo Liu, Hubei (CN); Qiang Gong, Hubei (CN)

(73) Assignee: WUHAN CHINA STAR OPTOELECTRONICS TECHNOLOGY CO., LTD., Hubei (CN)

( * ) Notice: Subject to any disclaimer, the term of this patent is extended or adjusted under 35 U.S.C. 154(b) by 0 days.

(21) Appl. No.: 17/613,013

(22) PCT Filed: Oct. 12, 2021

(86) PCT No.: PCT/CN2021/123351
§ 371 (c)(1),
(2) Date: Nov. 19, 2021

(87) PCT Pub. No.: WO2023/050473
PCT Pub. Date: Apr. 6, 2023

(65) Prior Publication Data
US 2024/0055439 A1 Feb. 15, 2024

(30) Foreign Application Priority Data
Sep. 30, 2021 (CN) .......................... 202111160994.X

(51) Int. Cl.
*G02F 1/1345* (2006.01)
*H10D 86/40* (2025.01)
(52) U.S. Cl.
CPC ....... *G02F 1/13454* (2013.01); *H10D 86/441* (2025.01)

(58) Field of Classification Search
CPC .. H01L 27/124; G02F 1/13454; H10D 86/441
See application file for complete search history.

(56) References Cited

U.S. PATENT DOCUMENTS

| | | | |
|---|---|---|---|
| 2017/0256583 A1* | 9/2017 | Choi | G02F 1/13452 |
| 2019/0165078 A1 | 5/2019 | Tsuruoka | |

FOREIGN PATENT DOCUMENTS

| | | |
|---|---|---|
| CN | 107346070 A | 11/2017 |
| CN | 107749239 A | 3/2018 |

(Continued)

OTHER PUBLICATIONS

Chinese Office Action issued in corresponding Chinese Patent Application No. 202111160994.X dated Apr. 22, 2022, pp. 1-7.

(Continued)

*Primary Examiner* — Peter M Albrecht
(74) *Attorney, Agent, or Firm* — PV IP PC; Wei Te Chung

(57) ABSTRACT

A display panel and a display device are disclosed. The display panel includes bonding pads placed in the bonding region, a driving chip, and a conductive resin connected to the bonding pads. The driving chip comprises a first region close to the display region and a second region away from the display region. The second region has a plurality of driving terminals. The driving terminals and the corresponding bonding pads are one-by-one electrically connected to each other. The thickness of at least a part of the conductive resin corresponding to the first region is set to be greater than the thickness of the conductive resin corresponding to the second region to compensate the height difference caused by the raise of the driving terminals when the driving chip is bonded. This ensures that the driving chip could be well bonded on the display panel and avoids the shallow donor conductivity.

18 Claims, 8 Drawing Sheets

(56) References Cited

FOREIGN PATENT DOCUMENTS

| | | | | | |
|---|---|---|---|---|---|
| CN | 108962775 | A | | 12/2018 | |
| CN | 109143699 | A | | 1/2019 | |
| CN | 109949703 | A | | 6/2019 | |
| CN | 110018598 | A | * | 7/2019 | ......... G02F 1/13454 |
| CN | 111326529 | A | | 6/2020 | |
| CN | 111383554 | A | | 7/2020 | |
| CN | 112037649 | A | | 12/2020 | |
| CN | 112235942 | A | | 1/2021 | |
| CN | 112530291 | A | | 3/2021 | |
| CN | 112599574 | A | | 4/2021 | |
| CN | 112736055 | A | | 4/2021 | |
| CN | 113223411 | A | | 8/2021 | |
| CN | 113407058 | A | | 9/2021 | |
| JP | H08154903 | A | | 6/1996 | |
| JP | H11329542 | A | | 11/1999 | |
| JP | 2005191386 | A | | 7/2005 | |
| JP | 2006013305 | A | | 1/2006 | |
| JP | 2020190588 | A | | 11/2020 | |
| KR | 20190106977 | A | | 9/2019 | |

OTHER PUBLICATIONS

Notification to Grant Patent Right for Invention issued in corresponding Chinese Patent Application No. 202111160994.X dated Jun. 28, 2022, pp. 1-4.
International Search Report in International application No. PCT/CN2021/123351, mailed on Mar. 28, 2022.
Written Opinion of the International Searching Authority in International application No. PCT/CN2021/123351, mailed on Mar. 28, 2022.

* cited by examiner

DISPLAY PANEL AND DISPLAY DEVICE

FIELD OF THE DISCLOSURE

The present disclosure relates to a display technology, and more particularly, to a display panel and a display device.

BACKGROUND

In order to reduce the size of the bottom side frame of a chip on glass (COG) display panel, the design of the driving chip is improved to achieve the super narrow bottom side frame. Specifically, the driving terminals, for transmitting display signals, are placed only at one side of the driving chip and other regions do not have any driving terminals. However, in this case, the driving terminals are not evenly distributed on the driving chip and this design will result in uneven supports of the driving chip. That is, when the driving chip is bonded on the display panel, a "seesaw" effect would occur and some driving terminals would raise. Accordingly, the conductive particles between the driving terminals and the display panel have a shallow donor conductivity and the driving terminals cannot be correctly bonded on the pad of the display panel. This reduces the performance of the display panel and the display panel may not normally work.

SUMMARY

One objective of an embodiment of the present disclosure is to provide a display panel and a display device, to solve the above-mentioned issue of "seesaw" effect when the driving chips are bonded on the display panel, which makes some driving terminals raise and unable to be bonded on the display panel.

According to an embodiment of the present disclosure, a display panel is disclosed. The display panel includes a display region and a bonding region, placed at a side of the display region. The bonding region includes a plurality of bonding pads, a driving chip, and a conductive resin that is connected to the plurality of bonding pads and the driving chip. The conductive resin is an anisotropic conductive adhesive. The driving chip includes a first region close to the display region and a second region away from the display region. The second region includes a plurality of driving terminals. The plurality of driving terminals and the corresponding bonding pads are one-by-one electrically connected to each other. A thickness of at least a part of the conductive resin corresponding to the first region is greater than a thickness of the conductive resin corresponding to the second region.

According to an embodiment of the present disclosure, the driving chip includes a first side close to the display region. The first region corresponding to at least the part of the conductive resin includes a blank region. A thickness of the conductive resin corresponding to the blank region gradually reduces from the first side to a side away from the first side.

According to an embodiment of the present disclosure, a thickness of the conductive resin corresponding to the blank region reduces in a step reduction from the first side to the side away from the first side and/or reduces in a gradient reduction from the first side to the side away from the first side.

According to an embodiment of the present disclosure, the blank region is the entire first region.

According to an embodiment of the present disclosure, the driving terminals in the second region are arranged in at least two rows, and each of the driving terminals in a row and the first side have a same distance in between.

According to an embodiment of the present disclosure, the second region includes a first sub-region, a second sub-region and a third sub-region orderly arranged along a direction of the first side. Each of the driving terminals in a same row in the second sub-region and the first side have a same distance in between. A distance between each of the driving terminals in a same row in the first sub-region and the first side along a direction from the first sub-region toward the second sub-region gradually reduces. A distance between each of the driving terminals in a same row in the third sub-region and the first side along the direction from the first sub-region toward the second sub-region gradually increases.

According to an embodiment of the present disclosure, a display panel is disclosed. The display panel includes a display region and a bonding region, placed at a side of the display region. The bonding region includes a plurality of bonding pads, a driving chip, and a conductive resin that is connected to the plurality of bonding pads and the driving chip. The driving chip includes a first region close to the display region and a second region away from the display region. The second region includes a plurality of driving terminals. The plurality of driving terminals and the corresponding bonding pads are one-by-one electrically connected to each other. A thickness of at least a part of the conductive resin corresponding to the first region is greater than a thickness of the conductive resin corresponding to the second region.

According to an embodiment of the present disclosure, the driving chip includes a first side close to the display region. The first region corresponding to at least the part of the conductive resin includes a blank region. A thickness of the conductive resin corresponding to the blank region gradually reduces from the first side to a side away from the first side.

According to an embodiment of the present disclosure, a thickness of the conductive resin corresponding to the blank region reduces in a step reduction from the first side to the side away from the first side and/or reduces in a gradient reduction from the first side to the side away from the first side.

According to an embodiment of the present disclosure, the blank region is the entire first region.

According to an embodiment of the present disclosure, the driving terminals in the second region are arranged in at least two rows, and each of the driving terminals in a row and the first side have a same distance in between.

According to an embodiment of the present disclosure, the second region comprises a first sub-region, a second sub-region and a third sub-region orderly arranged along a direction of the first side. Each of the driving terminals in a same row in the second sub-region and the first side have a same distance in between. A distance between each of the driving terminals in a same row in the first sub-region and the first side along a direction from the first sub-region toward the second sub-region gradually reduces. A distance between each of the driving terminals in a same row in the third sub-region and the first side along the direction from the first sub-region toward the second sub-region gradually increases.

According to an embodiment of the present disclosure, the first region includes a dummy terminal region having a plurality of dummy terminals. The blank region includes a first blank region and a second blank region. The first blank region, the dummy terminal region and the second blank region are orderly arranged. A thickness of the conductive resin corresponding to the first blank region gradually reduces along a direction from the first side to a place far away from the first side. A thickness corresponding to the second blank region gradually reduces along the direction from the first side to the place far away from the first side.

According to an embodiment of the present disclosure, a thickness of the conductive resin corresponding to the first blank region gradually reduces along a direction from the dummy terminal region to a place far away from the dummy terminal region. A thickness corresponding to the second blank region gradually reduces along the direction from the dummy terminal region to the place far away from the dummy terminal region.

According to an embodiment of the present disclosure, the driving thermals in the second region are arranged in at least two rows. The driving terminals in a row and the first side have a same distance in between.

According to an embodiment of the present disclosure, the second region comprises a first sub-region, a second sub-region and a third sub-region orderly arranged along a direction of the first side. Each of the driving terminals in a same row in the second sub-region and the first side have a same distance in between. A distance between each of the driving terminals in a same row in the first sub-region and the first side along a direction from the first sub-region toward the second sub-region gradually reduces. A distance between each of the driving terminals in a same row in the third sub-region and the first side along a direction from the third sub-region toward the second sub-region gradually reduces.

According to an embodiment of the present disclosure, each row of the driving terminals in the second sub-region corresponds to at least two rows of the driving terminals in the first sub-region and the third sub-region.

According to an embodiment of the present disclosure, a thickness difference between at least part of the conductive resin in the first region and the conductive resin in the second region is greater than or equal to 0.1 micron.

According to an embodiment of the present disclosure, the display panel further includes a flexible circuit board placed in the bonding region. The flexible circuit board has a main body section and a connection section. The main body section is placed at one side of the display region of the driving chip facing away the display region and the connection section is placed at opposite sides of the driving chip.

According to an embodiment of the present disclosure, a display device is disclosed. The display device comprises a display panel. The display panel includes a display region and a bonding region, placed at a side of the display region. The bonding region includes a plurality of bonding pads, a driving chip, and a conductive resin that is connected to the plurality of bonding pads and the driving chip. The driving chip includes a first region close to the display region and a second region away from the display region. The second region includes a plurality of driving terminals. The plurality of driving terminals and the corresponding bonding pads are one-by-one electrically connected to each other. A thickness of at least a part of the conductive resin corresponding to the first region is greater than a thickness of the conductive resin corresponding to the second region.

According to an embodiment of the present disclosure, a display panel and a display device are disclosed. The display panel includes a plurality of bonding pads placed in the bonding region, a driving chip, and a conductive resin connected to the plurality of bonding pads. The driving chip comprises a first region close to the display region and a second region away from the display region. The second region has a plurality of driving terminals. The plurality of driving terminals and the corresponding bonding pads are one-by-one electrically connected to each other. The thickness of at least a part of the conductive resin corresponding to the first region is set to be greater than the thickness of the conductive resin corresponding to the second region to compensate the height difference caused by the raise of the driving terminals when the driving chip is bonded. This ensures that the driving chip could be well bonded on the display panel and avoids the shallow donor conductivity.

BRIEF DESCRIPTION OF THE DRAWINGS

To describe the technical solutions in the embodiments of this application more clearly, the following briefly introduces the accompanying drawings required for describing the embodiments. Apparently, the accompanying drawings in the following description show merely some embodiments of this application, and a person of ordinary skill in the art may still derive other drawings from these accompanying drawings without creative efforts.

100 Display panel; 200 Driving chip; 300 Conductive resin; 301 Conductive particles; 400 FPC;
100a Display region; 100b Bonding region; 101 Bonding pad; 1001b First bonding region;

1002b Second bonding region; 102 Substrate; 103 Driving circuit layer; 104 Planarization layer; 105 First transparent electrode layer; 106 Second transparent electrode layer;

107 Light blocking layer; 1031 Semiconductor layer; 1032 Gate insulating layer; 1033 Gate layer; 1034 Interlayer medium layer; 1035 Source/drain metal layer 201 First side; 202 Second side; 203 Third side; 204 Fourth side;

210 First region; 211 Blank region; 220 Second region; 221 Driving terminal;

2111 First blank region 2111; 2112 Second blank region 2112

2121 Dummy terminal; 2201 First sub-region; 2202 Second sub-region; 2203 Third sub-region;

401 Main body section; 402 Connection section

DETAILED DESCRIPTION

It is understood that terminologies, such as "center," "longitudinal," "horizontal," "length," "width," "thickness," "upper," "lower," "before," "after," "left," "right," "vertical," "horizontal," "top," "bottom," "inner," "outer," "clockwise," and "counterclockwise," are locations and positions regarding the figures. These terms merely facilitate and simplify descriptions of the embodiments instead of indicating or implying the device or components to be arranged on specified locations, to have specific positional structures and operations. These terms shall not be construed in an ideal or excessively formal meaning unless it is clearly defined in the present specification.

Different methods or examples are introduced to elaborate different structures in the embodiments of the present disclosure. To simplify the method, only specific components and devices are elaborated by the present disclosure. These embodiments are truly exemplary instead of limiting the present disclosure. Identical numbers and/or letters for reference are used repeatedly in different examples for simplification and clearance. It does not imply that the relations between the methods and/or arrangement. The methods proposed by the present disclosure provide a variety of examples with a variety of processes and materials. However, persons skilled in the art understand ordinarily that the application of other processes and/or the use of other kinds of materials are possible.

Figure 1A:
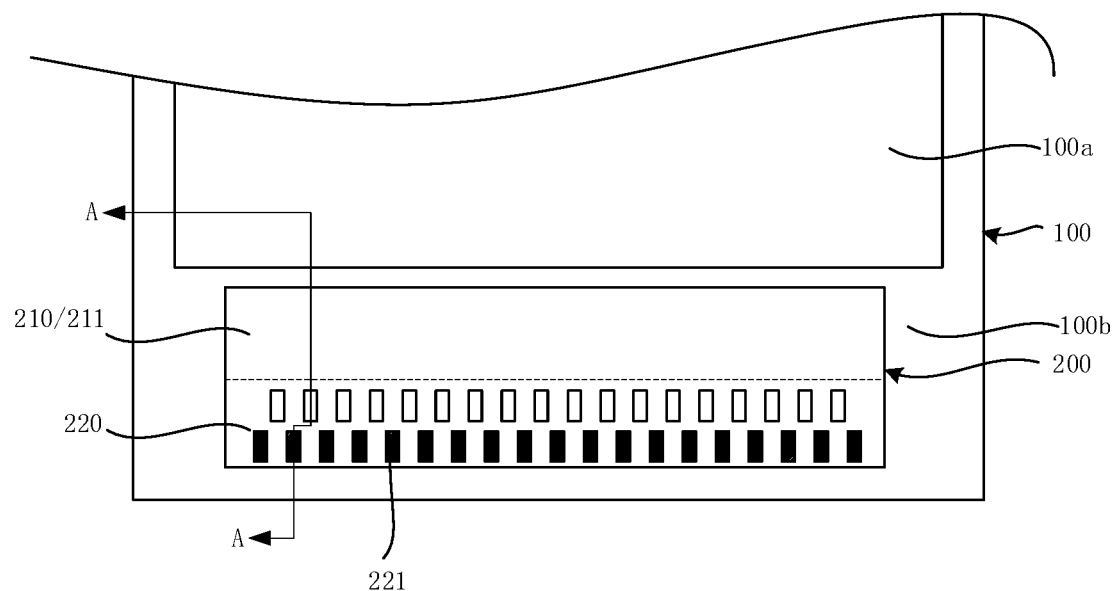
FIG. 1A is a diagram of a display panel according to an embodiment of the present disclosure.
Figure 1B:
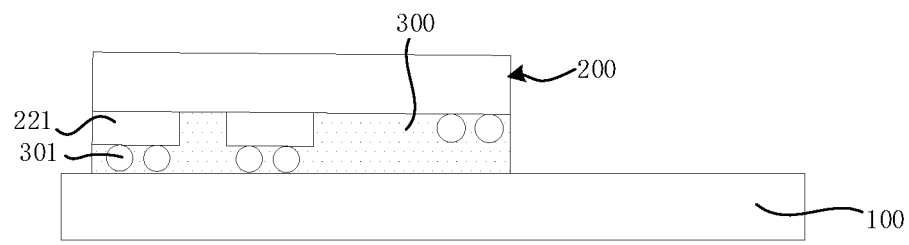
FIG. 1B is a diagram of a cross-section along the A-A' line of the display panel shown in FIG. 1A.
Figure 9:
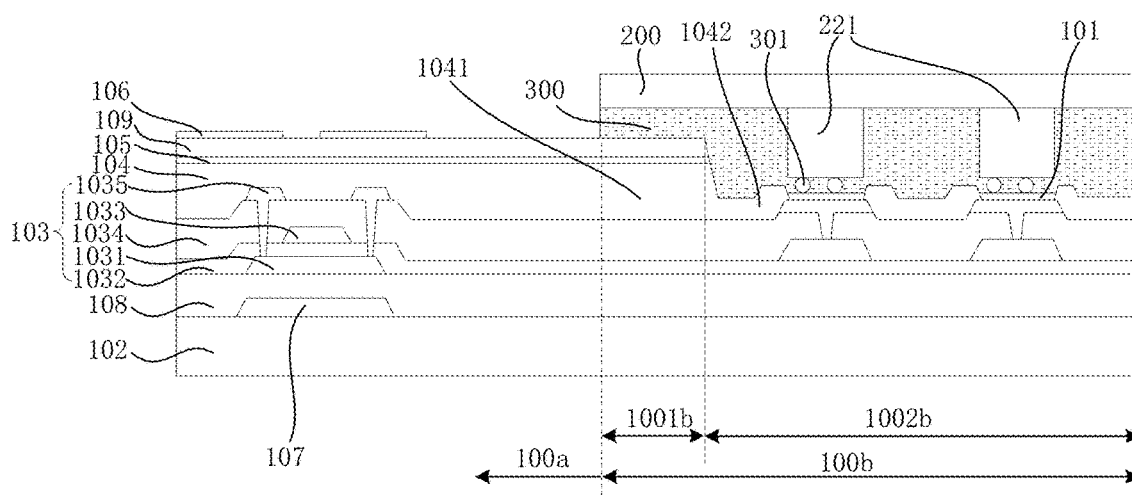
FIG. 9 is a diagram of a cross-section of a display panel according to an embodiment of the present disclosure.

Please refer to FIG. 1A, FIG. 1B and FIG. 9. FIG. 1A is a diagram of a display panel according to an embodiment of the present disclosure. FIG. 1B is a diagram of a cross-section along the A-A' line of the display panel shown in FIG. 1A. FIG. 9 is a diagram of a cross-section of a display panel according to an embodiment of the present disclosure. According to an embodiment, a display panel is disclosed. The display panel 100 includes a display region 100a and a bonding region 100b. The bonding region 100b is placed at one side of the display region 100a. The bonding region 100b includes a plurality of bonding pads 101, a driving chip 200, and a conductive resin 300 electrically connected to the bonding pads 101 and the driving chip 200.

The driving chip 200 is placed in the bonding region in a way of COG. The driving chip 200 comprises a first region 210 close to the display region 100a and a second region 220 away from the display region 100a. The second region 220 comprises a plurality of driving terminals 221. The driving terminals 221 and the corresponding bonding pads 101 are one-by-one electrically connected to each other through the conductive resin 300 such that the driving chip 200 could transfer the signal to the display region 100a.

Specifically, the conductive resin 300 is an anisotropic conductive adhesive. The conductive resin 300 has multiple conductive particles 301. The driving terminals 221 and the bonding pads 101 are electrically connected to each other through extruding the conductive particles 301.

After the driving chip 200 is aligned with the display panel 100, because at least a part of the first region 210 does not have any terminals, the driving chip 200 may have an uneven supporting force because the driving chip 200 is supported in some regions and is not supported by the terminals in other regions. Accordingly, the driving chip 200 may tilt from the side with no terminal toward the side close to the display region 100a and thus the side of the driving chip 200 away from the side with no terminals raises. In this way, the driving terminals 221 and the bonding pads 101 cannot extrude the conductive particles 301 in the conductive resin to reform the conductive particles 301 and thus the driving terminals 221 cannot be electrically connected to the corresponding bonding pads 101 and part of the driving terminals have the shallow conduction effect.

Therefore, the present disclosure arranges the thickness of at least a part of the conductive resin 300 corresponding to the first region 210 to be thicker than the thickness of the conductive resin 300 corresponding to the second region 220. The thickness difference is used to compensate for the height difference caused by the raise of the driving terminals 221 of the driving chip 200. In this way, after the driving chip 200 and the display panel 100 are laminated, the at least part of the conductive resin 300 corresponding to the first region 210 is thicker than the conductive resin 300 corresponding to the second region 220 such that the conductive particles 301 between the driving terminals 221 and the corresponding bonding pads 101 could be pressed to reform. This ensures the electrical connection between the driving chip 200 and the corresponding bonding pads 101 and thus the driving chip 200 could be correctly bonded on the display panel, and the conductive particles 301 do not have the shallow conduction effect.

Specifically, the thickness difference between at least part of the conductive resin 300 corresponding to the first region 210 and the conductive resin 300 corresponding to the second region 220 is greater than or equal to 0.1 micron.

In order to ensure that the conductive resin 300 has different thicknesses corresponding to different regions of bonding region 100b for a better support, in an embodiment, the liquidity of the conductive resin 300 should be properly adjusted. For example, the constituted materials of the conductive resin 300 should be replaced with those having lower liquidity or a material having lower liquidity should be added into the conductive resin 300 such that the conductive resin 300 could have a lower liquidity.

Figure 2A:
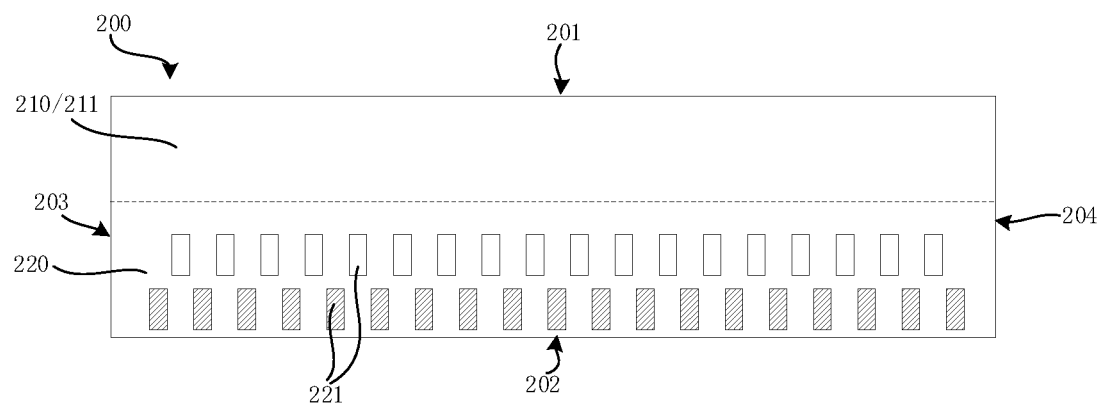
FIG. 2A is a diagram of a driving chip according to a first embodiment of the present disclosure.

Please refer to FIG. 2A. FIG. 2A is a diagram of a driving chip according to a first embodiment of the present disclosure. The driving chip 200 includes a first side 201 close to the display region 100a. The first region 210 corresponding to at least the part of the conductive resin 300 includes a blank region 211. It should be noted that the blank region 211 is the region with no terminals of the driving chip 200. Because there is no terminal in the blank region 211, the driving terminals 221 placed in the second region 220 may raise.

The driving chip 200 further comprises a second side 202, a third side 203 and a fourth side 204. The first side 201 and the second side 202 are oppositely placed. The third side 203 and the fourth side 204 are oppositely placed. The third side 203 is respectively connected to the first side 201 and the second side 202. The fourth side 204 is respectively connected to the first side 201 and the second side 202.

The thickness of the conductive resin 300 corresponding to the blank region 211 gradually reduces from the first side 201 to a side away from the first side 201. Along the direction from the first side 201 to a side away from the first side 201, the raise degree of the driving chip 200 gradually increases. In this embodiment, because the thickness of the conductive resin 300 corresponding to the blank region 211 gradually reduces along the same direction, it could adapt to different raise degrees of the driving chip 200.

The thickness variation of the conductive resin 300 is not limited to a certain number according to the present disclosure as long as it is adjusted according to the raise degree of the driving chip 200.

Specifically, the thickness of the conductive resin 300 corresponding to the blank region 211 reduces in a step reduction from the first side 201 to the side away from the first side 201. In another embodiment, the thickness of the conductive resin 300 corresponding to the blank region 211 reduces in a gradient reduction from the first side 201 to the side away from the first side 201. For example, the thickness of the conductive resin 300 corresponding to the blank region 211 linearly reduces from the first side 201 to the side away from the first side 201. In another embodiment, the thickness of the conductive resin 300 corresponding to the blank region 211 linearly reduces in a way combining the gradient reduction and the step reduction from the first side 201 to the side away from the first side 201.

In the following disclosure, the positions and the arrangement of the driving terminals 221 on the driving chip 200 will be illustrated in detail.

Figure 2B:
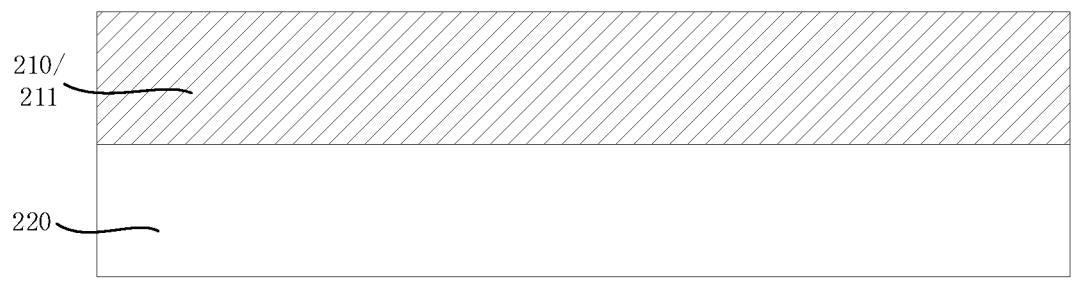
FIG. 2B is a diagram showing a thickness of the conductive resin corresponding to the driving chip shown in FIG. 2A.
Figure 3A:
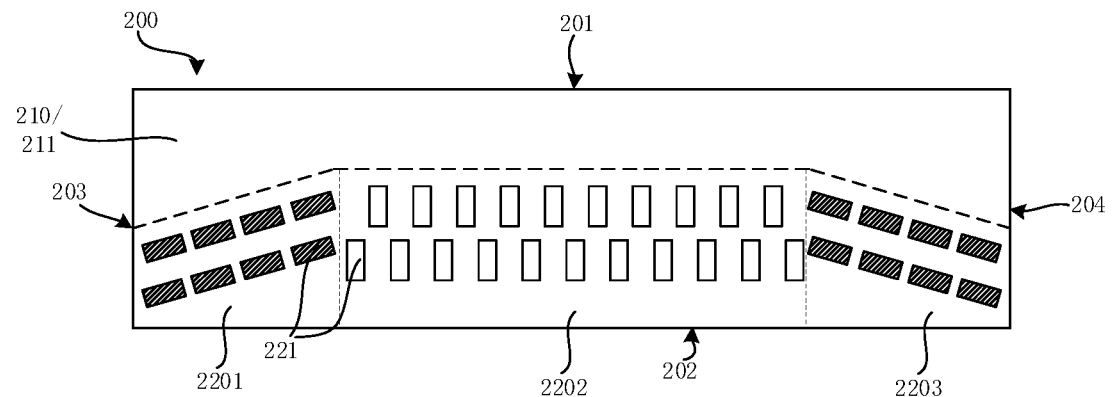
FIG. 3A is a diagram of a driving chip according to a second embodiment of the present disclosure.
Figure 3B:
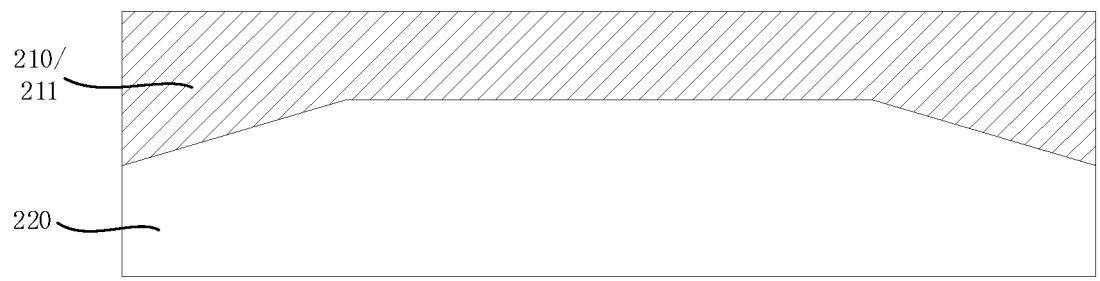
FIG. 3B is a diagram showing a thickness of the conductive resin corresponding to the driving chip shown in FIG. 3A.

Please refer to FIGS. 2A-2B and FIGS. 3A-3B. FIG. 2B is a diagram showing a thickness of the conductive resin corresponding to the driving chip shown in FIG. 2A. FIG. 3A is a diagram of a driving chip according to a second embodiment of the present disclosure. FIG. 3B is a diagram showing a thickness of the conductive resin corresponding to the driving chip shown in FIG. 3A.

In this embodiment, the blank region 211 is the entire first region 210. Because the entire first region 210 is the blank region 211, the first region 210 comprises no driving terminal 221 and no dummy terminal as a support. Therefore, all the driving terminals 221 in the second region 220 raise. In this embodiment, the thickness of the conductive resin 300 corresponding to the blank region 211 reduces from the first side 201 to the side away from the first side 201 to compensate for the raise of the driving terminals 221.

Please refer to FIG. 2A and FIG. 2B. Here, the blank region 211 is the entire first region 210. The driving terminals 221 in the second region 220 are arranged in at least two rows. Each row of the driving terminals 221 is arranged in a straight line along the direction of the first side 201. The distance between each of the driving terminals 221 in the same row and the first side 201 is the same.

The row of the driving terminals 221 closer to the first side 201 is closer to the center of the driving chip 200 compared with the row of the driving terminals 221 that is far away from the first side 201. The row of the driving terminals 221 that is far away from the first side 201 is closer to the edge of the driving chip and is easier to raise. Therefore, in this embodiment, the thickness of the conductive resin 300 corresponding to the first region 210 reduces from the first side 201 to the side away from the first side 201 to compensate for the raise of the driving terminals 221.

Please refer to FIG. 3A and FIG. 3B. The second region 220 includes a first sub-region 2201, a second sub-region 2202 and a third sub-region 2203 orderly arranged along a direction of the first side 201. Here, each of the driving terminals 221 in the same row in the second sub-region 2202 and the first side 201 have the same distance in between. The distance between each of the driving terminals 221 in a same row in the first sub-region 2201 and the first side 201 along a direction from the first sub-region 2201 toward the second sub-region 2202 gradually reduces. The distance between each of the driving terminals 221 in a same row in the third sub-region 2203 and the first side 201 along the direction from the first sub-region 2201 toward the second sub-region 2202 gradually increases.

The first sub-region 2201 and the third sub-region 2203 are placed at two ends of the second sub-region 2202. The driving terminals 221 in the first sub-region 2201 are arranged along a sloped line. The driving terminals 221 in the third sub-region 2203 are arranged along a sloped line. The driving terminals 221 in the second sub-region 2202 are arranged along a horizontal straight line. In this way, when the driving chip 200 is bonded on the display panel 100 in a way of COG, the bonding pads 101 of the display panel at two ends are arranged along corresponding two sloped lines. This allows the bending region of the fan out wires to be placed in the bonding region 100b. This could reduce the width of the side frame where the fan out region of the display panel 100 is placed and thus achieve the purpose of the narrow side frame.

The row of the driving terminals 221 closer to the first side 201 is closer to the center of the driving chip 200 compared with the row of the driving terminals 221 that is far away from the first side 201. The row of the driving terminals 221 that is far away from the first side 201 is closer to the edge of the driving chip and is easier to raise. Therefore, in this embodiment, the thickness of the conductive resin 300 corresponding to the first region 210 reduces from the first side 201 to the side away from the first side 201 to compensate for the raise of the driving terminals 221.

Figure 4A:
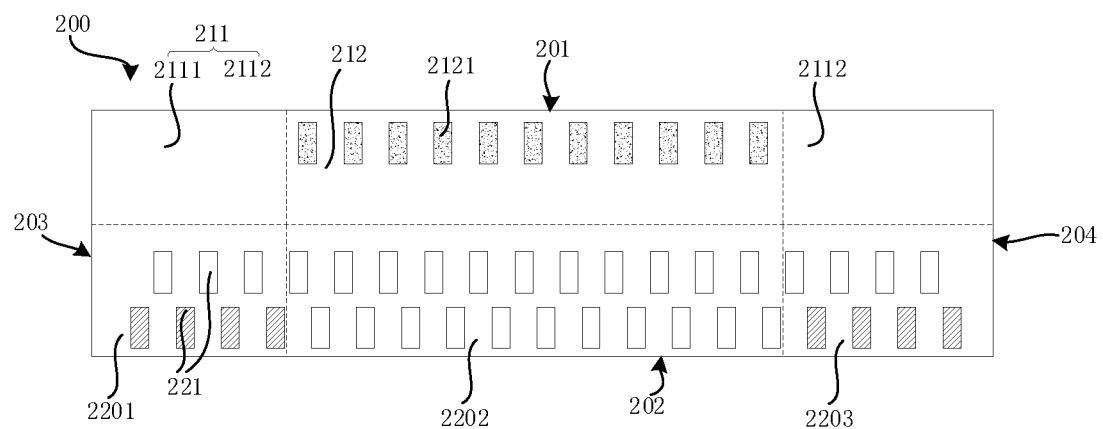
FIG. 4A is a diagram of a driving chip according to a third embodiment of the present disclosure.
Figure 4B:
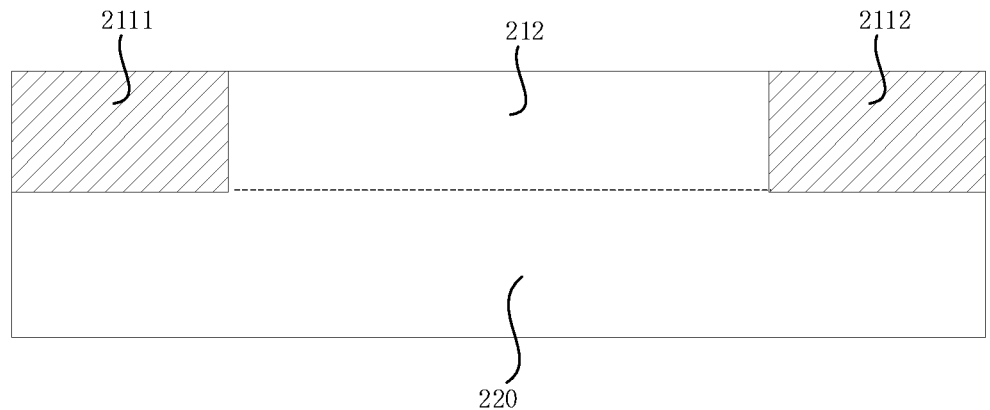
FIG. 4B is a diagram showing a thickness of the conductive resin corresponding to the driving chip shown in FIG. 4A.
Figure 5A:
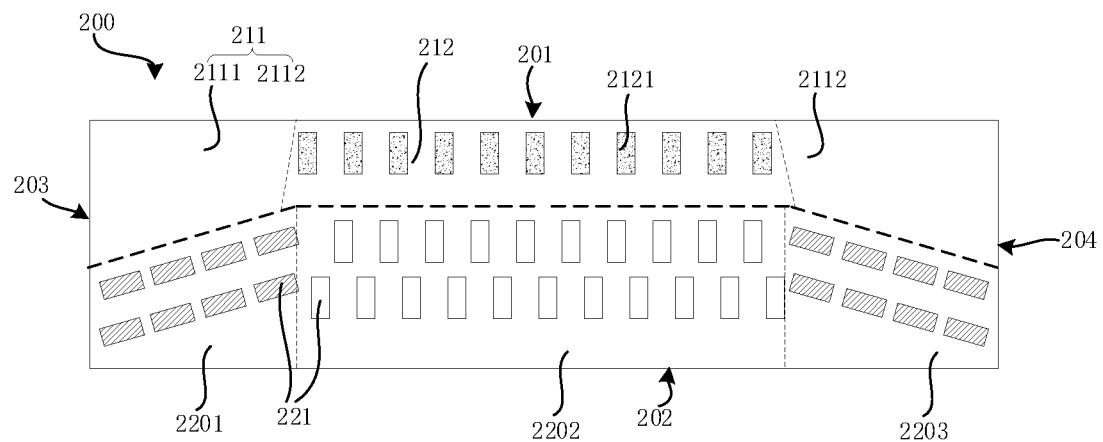
FIG. 5A is a diagram of a driving chip according to a fourth embodiment of the present disclosure.
Figure 5B:
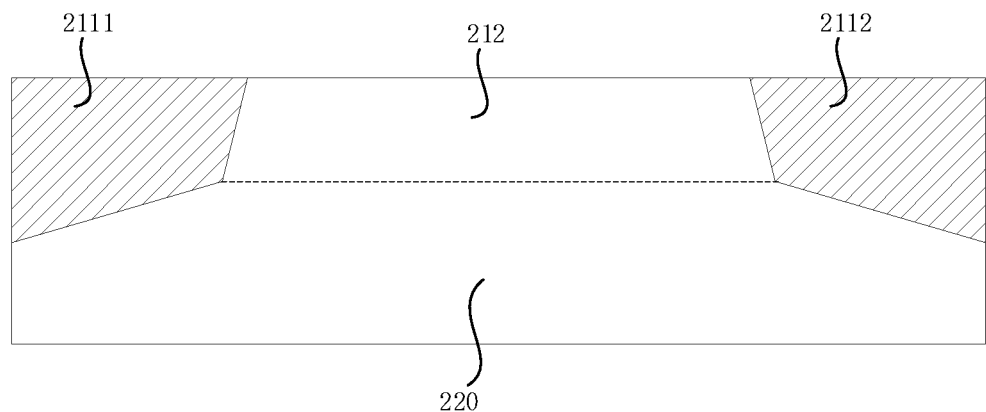
FIG. 5B is a diagram showing a thickness of the conductive resin corresponding to the driving chip shown in FIG. 5A.
Figure 6A:
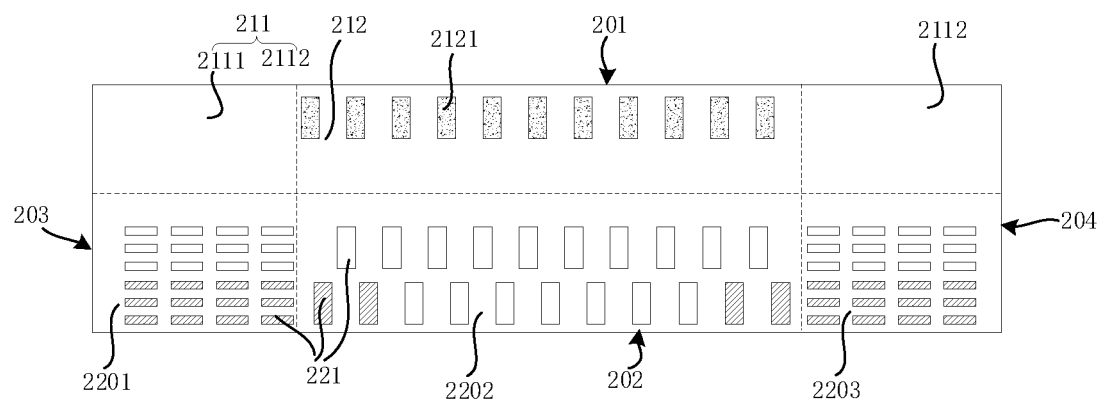
FIG. 6A is a diagram of a driving chip according to a fifth embodiment of the present disclosure.
Figure 6B:
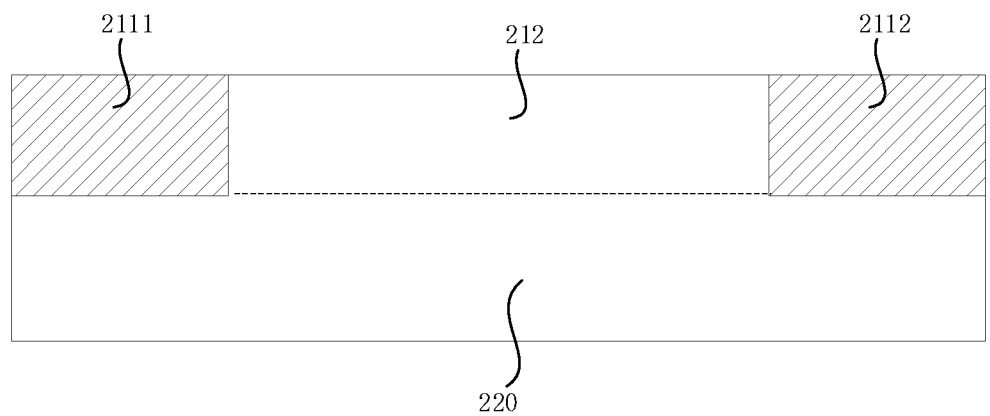
FIG. 6B is a diagram showing a thickness of the conductive resin corresponding to the driving chip shown in FIG. 6A.
Figure 7A:
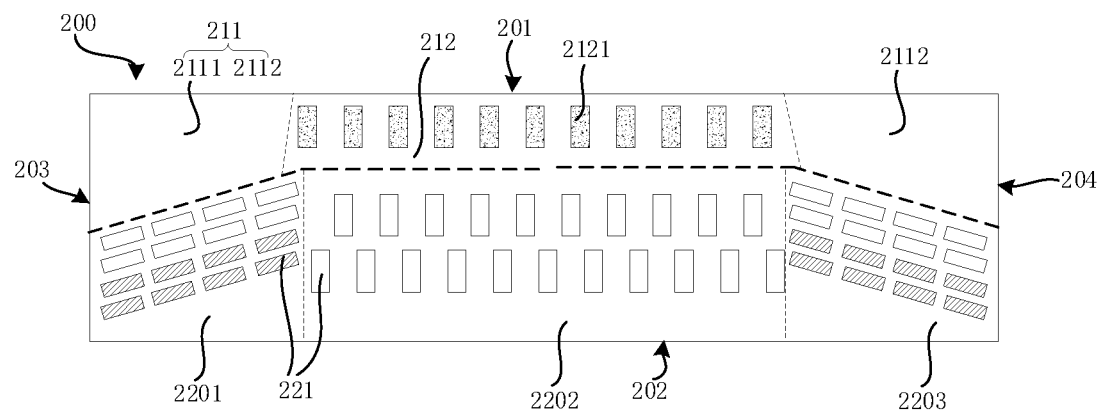
FIG. 7A is a diagram of a driving chip according to a sixth embodiment of the present disclosure.
Figure 7B:
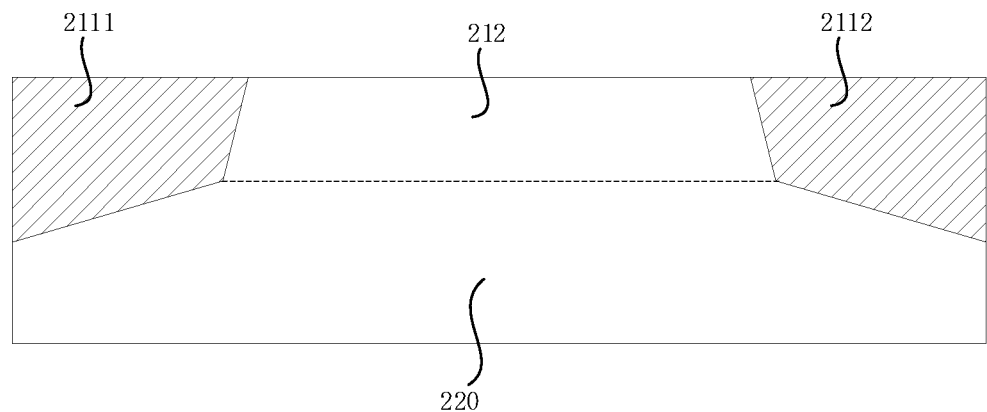
FIG. 7B is a diagram showing a thickness of the conductive resin corresponding to the driving chip shown in FIG. 7A.

Please refer to FIGS. 4A and 4B, FIGS. 5A and 5B, FIGS. 6A and 6B and FIGS. 7A and 7B. FIG. 4A is a diagram of a driving chip according to a third embodiment of the present disclosure. FIG. 4B is a diagram showing a thickness of the conductive resin corresponding to the driving chip shown in FIG. 4A. FIG. 5A is a diagram of a driving chip according to a fourth embodiment of the present disclosure. FIG. 5B is a diagram showing a thickness of the conductive resin corresponding to the driving chip shown in FIG. 5A. FIG. 6A is a diagram of a driving chip according to a fifth embodiment of the present disclosure. FIG. 6B is a diagram showing a thickness of the conductive resin corresponding to the driving chip shown in FIG. 6A. FIG. 7A is a diagram of a driving chip according to a sixth embodiment of the present disclosure. FIG. 7B is a diagram showing a thickness of the conductive resin corresponding to the driving chip shown in FIG. 7A.

The difference between FIGS. 4A-7B and FIGS. 2A-3B is that the first region 210 comprises a dummy terminal region 212. The dummy terminal region 212 comprises a plurality of dummy terminals 2121. That is, the blank region 211 is a part of the first region 210. The blank region 211 is placed at two ends of the first region 210 and close to the third side 203 and the fourth side 204.

The blank region 211 comprises a first blank region 2111 and a second blank region 2112. The dummy terminal region 212 is placed between the first blank region 2111 and the second blank region 2112.

The driving terminals 221 transfer electrical signals. In contrast, the dummy terminals 2121 are used only as a support without transferring any electrical signals. When the driving chip 200 is bonded on the display panel, the dummy terminals 2121 are correspondingly one-by-one connected to the dummy pads of the display panel 100 such that the driving terminals 221 in the second region 220 corresponding to the dummy terminals 2121 could be one-by-one connected to the corresponding bonding pads 101 without any raise. However, because there is no dummy terminals 2121 in the first blank region 2111 and the second blank region 2112, the driving terminals 221 in the second region 220 corresponding to the first blank region 2111 and the second blank region 2112 cannot correctly be connected to the bonding pads 101 of the display panel 100 and raise.

In this embodiment, the thickness of the conductive resin 300 corresponding to the first blank region 2111 gradually reduces along a direction from the first side to a place far away from the first side. The thickness corresponding to the second blank region 2112 gradually reduces along the direction from the first side to the place far away from the first side to compensate for the raise of the driving terminals 221 in the second region 220 corresponding to the first blank region 2111 and the second blank region 2112.

Because the driving terminals 221 raise higher when the driving terminals 221 are farther from the dummy terminals 2121 along the direction from the dummy terminals 2121 to the place far from the dummy terminals 2121, the present disclosure arranges different rows of the driving terminals 221 differently. That is, the thickness of the conductive resin 300 corresponding to the first blank region 2111 gradually reduces along a direction from the dummy terminal region 212 to a place far away from the dummy terminal region 212. The thickness corresponding to the second blank region 2112 gradually reduces along the direction from the dummy terminal region 212 to the place far away from the dummy terminal region 212 to compensate for the raise of the driving terminals 221.

The driving terminals 221 in the second region 220 are arranged in at least two rows. The second region 220 comprises a first sub-region 2201, a second sub-region 2202 and a third sub-region 2203 arranged orderly arranged along a direction of the first side 201. The dummy terminal region 212 is placed correspondingly to the second sub-region 2202. The first blank region 2111 is placed correspondingly to the first sub-region 2201. The second blank region 2112 is placed correspondingly to the third sub-region 2203.

Please refer to FIG. 4A and FIG. 4B. The distance between each of the driving terminals 221 in the same row and the first side 201 remains the same. It could be understood that the row of the driving terminals 221 closer to the first side 201 is closer to the center of the driving chip 200 compared with the row of the driving terminals 221 that is far away from the first side 201. The row of the driving terminals 221 that is far away from the first side 201 is closer to the edge of the driving chip 200 and is easier to raise. Therefore, in this embodiment, the thickness of the conductive resin 300 corresponding to the first blank region 2111 reduces from the first side 201 to the side away from the first side 201. In addition, the thickness of the conductive resin 300 corresponding to the second blank region 2112 reduces from the first side 201 to the side away from the first side 201. This arrangement could compensate for the raise of the driving terminals 221.

Please refer to FIG. 5A and FIG. 5B. The distance between each of the driving terminals 221 in the second sub-region 2202 and the first side 201 is the same. The distance between each of the driving terminals 221 in the same row in the first sub-region 2201 and the first side 201 along a direction from the first sub-region 2201 toward the second sub-region 2202 gradually reduces. The distance between each of the driving terminals 221 in the same row in the third sub-region 2203 and the first side 201 along the direction from the first sub-region toward the second sub-region gradually increases.

Similarly, the first sub-region 2201 and the third sub-region 2203 are placed at two ends of the second sub-region 2202. The driving terminals 221 in the first sub-region 2201 are arranged along a sloped line. The driving terminals 221 in the third sub-region 2203 are arranged along a sloped line. The driving terminals 221 in the second sub-region 2202 are arranged along a horizontal straight line. In this way, when the driving chip 200 is bonded on the display panel 100 in a way of COG, the bonding pads 101 of the display panel at two ends are arranged along corresponding two sloped lines. This allows the bending region of the fan out wires to be placed in the bonding region 100b. This could reduce the width of the side frame where the fan out region of the display panel 100 is placed and thus achieve the purpose of the narrow side frame.

The driving terminals 221 in the second sub-region 2202 are closer to the center of the driving chip 200 compared with the driving terminals 221 in the first sub-region 2201 and the third sub-region 2203. The driving terminals 221 in the first sub-region 2201 and the third sub-region 2203 are easier to raise. Therefore, in this embodiment, the thickness of the conductive resin 300 corresponding to the first region 210 reduces from the first side 201 to the side away from the first side 201 to compensate for the raise of the driving terminals 221.

Please refer to FIGS. 6A-6B and FIGS. 7A-7B. In an embodiment, each row of the driving terminals 221 in the second sub-region 2202 corresponds to at least two rows of the driving terminals 221 in the first sub-region 2201 and the third sub-region 2203. Through this arrangement, the fan out wire could be electrically connected from the side of the first sub-region 2201 to the side of the driving terminals 221 close to the third side 203. Or, the fan out wire could be electrically connected from the side of the third sub-region 2203 to the side of the driving terminals 221 close to the fourth side 204 to reduce the wiring space. This further reduces the down side frame of the display panel 100.

Figure 8:
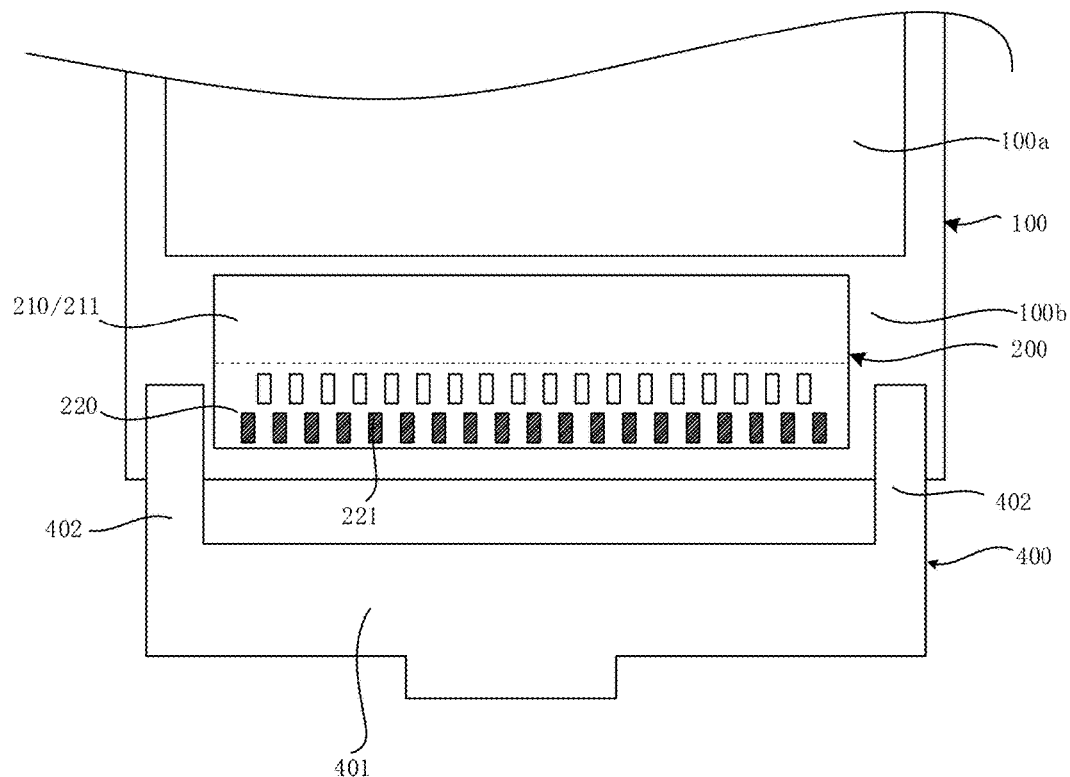
FIG. 8 is a diagram of a display panel according to another embodiment of the present disclosure.

Please refer to FIG. 8. FIG. 8 is a diagram of a display panel according to another embodiment of the present disclosure. The display panel 100 further includes a flexible circuit board 400 placed in the bonding region 100b. The flexible circuit board 400 includes a main body section 401 and a connection section 402. The connection section 402 is configured to connect to the driving terminals 221. The main body section 401 is placed at one side of the driving chip 200 facing away from the display region 100a and the connection section 402 is placed at opposite sides of the driving terminals 221.

Please refer to FIG. 9. The bonding region includes a first bonding region 1001b and the second bonding region 1002b. The first bonding region 1001b corresponds to the first region 210. The second bonding region 1002b corresponds to the second region 220. When the driving chip 200 is bonded on the display panel 100, the first bonding region 1001b is bonding and connected to the first region 210 and second bonding region 1002b is bonded and connected to the second region 220.

The film layer structure of the display panel 100 will be illustrated as below.

The display panel 100 includes a substrate 102, a driving circuit layer 103, a planarization layer 104, a first transparent electrode layer 105 and a second transparent electrode layer 106. The driving circuit layer 103 is placed on the substrate 102. The planarization layer 104 covers the driving circuit layer 103 and the substrate 102. The planarization layer 104 includes a first planarization part 1041 and a second planarization part 1042. The first planarization part 1041 is placed in the first bonding region 1001b and the second planarization part 1042 is placed in the second bonding region 1002b. The first transparent electrode layer 105 is placed on the side of the planarization layer 104 far away from the substrate 102. The second transparent electrode layer 106 is placed on the side of the first transparent electrode layer 105 far away from the substrate 102. Here, the thickness of the second planarization part 1042 is greater than the thickness of the first planarization part 1041.

In order to place the bonding pads 101, raise the electrical performance of the bonding pads and ensure that the adjacent metal layers in the first bonding region 1001b have no interference with each other, the first planarization part 1041 in the first bonding region 1001b is removed. This could reduce the thickness of the conductive resin corresponding to the blank region. In this way, the thickness difference between the conductive resin 300 corresponding to the blank region 211 and the conductive resin 300 corresponding to the second region 220 is reduced.

For example, the thickness of the driving terminals 221 is 9 microns. When the first planarization part 1041 is retained, the thickness difference between the conductive resin 300 corresponding to the blank region 211 and the conductive resin 300 corresponding to the second region 220 should be at least 9 microns. When the first planarization part 1041 is partially removed, for example, the thickness difference between the second planarization part 1042 and the first planarization part 1041 is about 2-3 microns. Thus, the thickness difference between the conductive resin 300 corresponding to the blank region 211 and the conductive resin 300 corresponding to the second region 220 is reduced to be 6-7 microns.

Specifically, the driving circuit layer 103 comprises a semiconductor layer 1031, a gate insulating layer 1032, a gate layer 1033, an interlayer medium layer 1034 and a source/drain metal layer 1035. The semiconductor layer 1031 is placed on the substrate 102. The gate insulating layer 1032 covers the semiconductor layer 1031. The gate layer 1033 is placed on the gate insulating layer 1032. The interlayer medium layer 1034 covers the gate layer 1033. The source/drain metal layer 1035 is placed on the interlayer medium layer 1034. The planarization layer 104 covers the source/drain metal layer 1035.

A light blocking layer 107 and a buffer layer 108 are placed between the substrate 102 and a driving circuit layer 103. The light blocking layer 107 is placed on the substrate 102. The buffer layer 108 covers the light blocking layer 107.

The first transparent electrode layer 105 is a pixel electrode and the second transparent electrode layer 106 is a common electrode. Or, the first transparent electrode layer 105 is a common electrode and the second transparent electrode layer 106 is a pixel electrode. An insulating layer 109 is placed between the first transparent electrode layer 105 and the second transparent electrode layer 106.

According to an embodiment of the present disclosure, a display device is disclosed. The display device comprises the above-mentioned display panel 100. The display device could be a cell phone, a tablet, a television, a display, a laptop, a digital frame, a navigator or any other devices or components having display functions.

In contrast to prior art, embodiments of the present disclosure provides a display panel and a display device. The display panel includes a plurality of bonding pads placed in the bonding region, a driving chip, and a conductive resin connected to the plurality of bonding pads. The driving chip comprises a first region close to the display region and a second region away from the display region. The second region has a plurality of driving terminals. The plurality of driving terminals and the corresponding bonding pads are one-by-one electrically connected to each other. The thickness of at least a part of the conductive resin corresponding to the first region is set to be greater than the thickness of the conductive resin corresponding to the second region to compensate the height difference caused by the raise of the driving terminals when the driving chip is bonded. This ensures that the driving chip could be well bonded on the display panel and avoids the shallow donor conductivity.

Above are embodiments of the present disclosure, which does not limit the scope of the present disclosure. Any modifications, equivalent replacements or improvements within the spirit and principles of the embodiment described above should be covered by the protected scope of the disclosure.

What is claimed is:

1. A display panel, comprising:
a display region; and
a bonding region, placed at a side of the display region, the bonding region comprising:
a plurality of bonding pads;
a driving chip; and
a conductive resin, connected to the plurality of bonding pads and the driving chip, wherein the conductive resin is an anisotropic conductive adhesive;
wherein the driving chip comprises a first region close to the display region and a second region away from the display region, the second region comprises a plurality of driving terminals, and the plurality of driving terminals and the corresponding bonding pads are one-by-one electrically connected to each other; and
wherein a thickness of at least a part of the conductive resin corresponding to the first region is greater than a thickness of the conductive resin corresponding to the second region, the driving chip comprises a first side close to the display region, the first region corresponding to at least the part of the conductive resin comprises a blank region, and a thickness of the conductive resin corresponding to the blank region gradually reduces from the first side to a side away from the first side.

2. The display panel of claim 1, wherein the thickness of the conductive resin corresponding to the blank region reduces in a step reduction from the first side to the side away from the first side and/or reduces in a gradient reduction from the first side to the side away from the first side.

3. The display panel of claim 1, wherein the blank region is the entire first region.

4. The display panel of claim 3, wherein the driving terminals in the second region are arranged in at least two rows, and each of the driving terminals in a row and the first side have a same distance in between.

5. The display panel of claim 3, wherein the second region comprises a first sub-region, a second sub-region, and a third sub-region orderly arranged along a direction of the first side; and
wherein a distance between each of the driving terminals in a same row in the second sub-region and the first side is the same; a distance between each of the driving terminals in a same row in the first sub-region and the first side along a direction from the first sub-region toward the second sub-region gradually reduces; and a distance between each of the driving terminals in a same row in the third sub-region and the first side along the direction from the first sub-region toward the second sub-region gradually increases.

6. A display panel, comprising:
a display region; and
a bonding region, placed at a side of the display region, the bonding region comprising:
a plurality of bonding pads;
a driving chip; and
a conductive resin, connected to the plurality of bonding pads and the driving chip;
wherein the driving chip comprises a first region close to the display region and a second region away from the display region, the second region comprises a plurality of driving terminals, and the plurality of driving terminals and the corresponding bonding pads are one-by-one electrically connected to each other; and
wherein a thickness of at least a part of the conductive resin corresponding to the first region is greater than a thickness of the conductive resin corresponding to the second region, the driving chip comprises a first side close to the display region, the first region corresponding to at least the part of the conductive resin comprises a blank region, and a thickness of the conductive resin corresponding to the blank region gradually reduces from the first side to a side away from the first side.

7. The display panel of claim 6, wherein the thickness of the conductive resin corresponding to the blank region reduces in a step reduction from the first side to the side away from the first side and/or reduces in a gradient reduction from the first side to the side away from the first side.

8. The display panel of claim 6, wherein the blank region is the entire first region.

9. The display panel of claim 8, wherein the driving terminals in the second region are arranged in at least two rows, and each of the driving terminals in a row and the first side have a same distance in between.

10. The display panel of claim 8, wherein the second region comprises a first sub-region, a second sub-region, and a third sub-region orderly arranged along a direction of the first side; and
wherein each of the driving terminals in a same row in the second sub-region and the first side have a same distance in between; a distance between each of the driving terminals in a same row in the first sub-region and the first side along a direction from the first sub-region toward the second sub-region gradually reduces; and a distance between each of the driving terminals in a same row in the third sub-region and the first side along the direction from the first sub-region toward the second sub-region gradually increases.

11. The display panel of claim 6, wherein the first region comprises a dummy terminal region, wherein the dummy terminal region comprises a plurality of dummy terminals; the blank region comprises a first blank region and a second blank region; and the first blank region, the dummy terminal region and the second blank region are orderly arranged;
wherein a thickness of the conductive resin corresponding to the first blank region gradually reduces along a direction from the first side to a place far away from the first side; and a thickness of the conductive resin corresponding to the second blank region gradually reduces along the direction from the first side to the place far away from the first side.

12. The display panel of claim 11, wherein the thickness of the conductive resin corresponding to the first blank region gradually reduces along a direction from the dummy terminal region to a place far away from the dummy terminal region; and the thickness of the conductive resin corresponding to the second blank region gradually reduces along the direction from the dummy terminal region to the place far away from the dummy terminal region.

13. The display panel of claim 12, wherein the driving terminals in the second region are arranged in at least two rows, and a distance between each of the driving terminals in a same row and the first side is the same.

14. The display panel of claim 12, wherein the second region comprises a first sub-region, a second sub-region, and a third sub-region orderly arranged along a direction of the first side; and
wherein a distance between each of the driving terminals in a same row in the second sub-region and the first side is the same; a distance between each of the driving terminals in a same row in the first sub-region and the first side along a direction from the first sub-region toward the second sub-region gradually reduces; and a distance between each of the driving terminals in a same row in the third sub-region and the first side along a direction from the third sub-region toward the second sub-region gradually reduces.

15. The display panel of claim 14, wherein each row of the driving terminals in the second sub-region corresponds to at least two rows of the driving terminals in the first sub-region and the third sub-region.

16. The display panel of claim 6, wherein a thickness difference between at least part of the conductive resin in the first region and the conductive resin in the second region is greater than or equal to 0.1 micron.

17. The display panel of claim 6, further comprising:
a flexible circuit board, placed in the bonding region, the flexible circuit board comprising:
a main body section; and
a connection section;
wherein the main body section is placed at one side of the driving chip facing away from the display region and the connection section is placed at opposite sides of the driving chip.

18. A display device, comprising a display panel, the display panel comprising:
a display region; and
a bonding region, placed at a side of the display region, the bonding region comprising:
a plurality of bonding pads;
a driving chip; and
a conductive resin, connected to the plurality of bonding pads and the driving chip;
wherein the driving chip comprises a first region close to the display region and a second region away from the display region, the second region comprises a plurality of driving terminals, and the plurality of driving terminals and the corresponding bonding pads are one-by-one electrically connected to each other; and
wherein a thickness of at least a part of the conductive resin corresponding to the first region is greater than a thickness of the conductive resin corresponding to the second region, the driving chip comprises a first side close to the display region, the first region corresponding to at least the part of the conductive resin comprises a blank region, and a thickness of the conductive resin corresponding to the blank region gradually reduces from the first side to a side away from the first side.

* * * * *